United States Patent [19]

Ishii et al.

[11] Patent Number: 4,807,190

[45] Date of Patent: Feb. 21, 1989

[54] SEMICONDUCTOR INTEGRATED CIRCUIT DEVICE

[75] Inventors: Kyoko Ishii, Tokyo; Kazumasa Yanagisawa, Kokubungi; Masaya Muranaka, Akishima, all of Japan

[73] Assignees: Hitachi Ltd.; Hitachi VLSI Engineering Corp., both of Tokyo, Japan

[21] Appl. No.: 17,533

[22] Filed: Feb. 24, 1987

[30] Foreign Application Priority Data

Mar. 12, 1986 [JP] Japan .................................. 61-52514

[51] Int. Cl.$^4$ ................................................ G11C 7/00
[52] U.S. Cl. ..................................... 365/189; 365/203; 307/269
[58] Field of Search ........................ 365/189, 203, 230; 307/269, 482

[56] References Cited

U.S. PATENT DOCUMENTS

| | | | |
|---|---|---|---|
| 4,503,343 | 3/1985 | Ohuchi | 365/203 X |
| 4,639,622 | 1/1987 | Goodwin et al. | 307/269 X |
| 4,649,523 | 3/1987 | Holder, Jr. et al: | 365/203 |
| 4,678,941 | 7/1987 | Chao et al. | 307/269 X |

Primary Examiner—Joseph A. Popek
Attorney, Agent, or Firm—Antonelli, Terry & Wands

[57] ABSTRACT

A dynamic RAM is provided in which an output voltage of a booster circuit for forming a word line selection timing signal is rendered greater than a power source potential and less than a predetermined potential by providing voltage limitation means, thereby preventing destruction of circuit elements receiving the output voltage.

46 Claims, 4 Drawing Sheets

SEMICONDUCTOR INTEGRATED CIRCUIT DEVICE

BACKGROUND OF THE INVENTION

This invention relates to a semiconductor integrated circuit device. More particularly, it relates to a technique which is effective when utilized for a semiconductor integrated circuit device, for example, a dynamic RAM that has a booster circuit for forming a timing signal having a high level above a power source potential.

In a semiconductor integrated circuit device such as a dynamic RAM which employs one-MOSFET type memory cells each being constructed of a storage capacitor and an address selecting MOSFET, a booster circuit (bootstrap circuit) is typically provided by which the selective level of a word line coupled to the gate of the address selecting MOSFET is raised to a potential higher than a power source potential. The reason that such a booster circuit is provided is that the gate (word line) level of the address selecting MOSFET in the memory cell is rendered higher than the power source potential thus, a high level for writing or rewriting information into the storage capacitor is prevented from lowering due to the threshold voltage of the MOSFET. In addition, in reading out information from the memory cell, a signal is transmitted to a data line fast and efficiently.

As such booster circuits, there have been proposed various booster circuits of, for example, the direct bootstrap system described in IEEE Journal of Solid-State Circuits, Vol. SC-16, No. 5, pp. 492-497.

SUMMARY OF THE INVENTION

As stated above, the output signal of a booster circuit serves to keep the voltage level of a write signal in a memory cell at a power source potential $V_{cc}$. Accordingly, it may be a voltage which is somewhat higher than the power source potential $V_{cc}$. The potential of the output signal, however, becomes a high voltage which is approximately double the power source potential $V_{cc}$. From the standpoint of protecting the circuit elements of a succeeding stage to which the output signal is applied, the potential of the output signal needs to be suppressed to some extent.

An object of this invention is to provide a semiconductor integrated circuit device of high reliability including a booster circuit.

Another object of this invention is to provide a semiconductor memory of high reliability including a booster circuit which raises the voltage of the selective level of word lines.

Another object of this invention is to provide a semiconductor integrated circuit device including a booster circuit which has the function of suppressing its output voltage.

The above and other objects and novel features of this invention will become apparent from the description of this specification and the accompanying drawings.

A typical aspect of performance of this invention is briefly summarized as follows:

Voltage limitation means is disposed on the input side or output side of a booster circuit, whereby the output signal of the booster circuit is boosted to a voltage which is higher than a power source potential but which is not higher than a predetermined potential.

According to the aforementioned means, circuit elements which receive the output signal of the booster circuit can be prevented from being destroyed.

DESCRIPTION OF THE PREFERRED EMBODIMENTS

Figure 2:
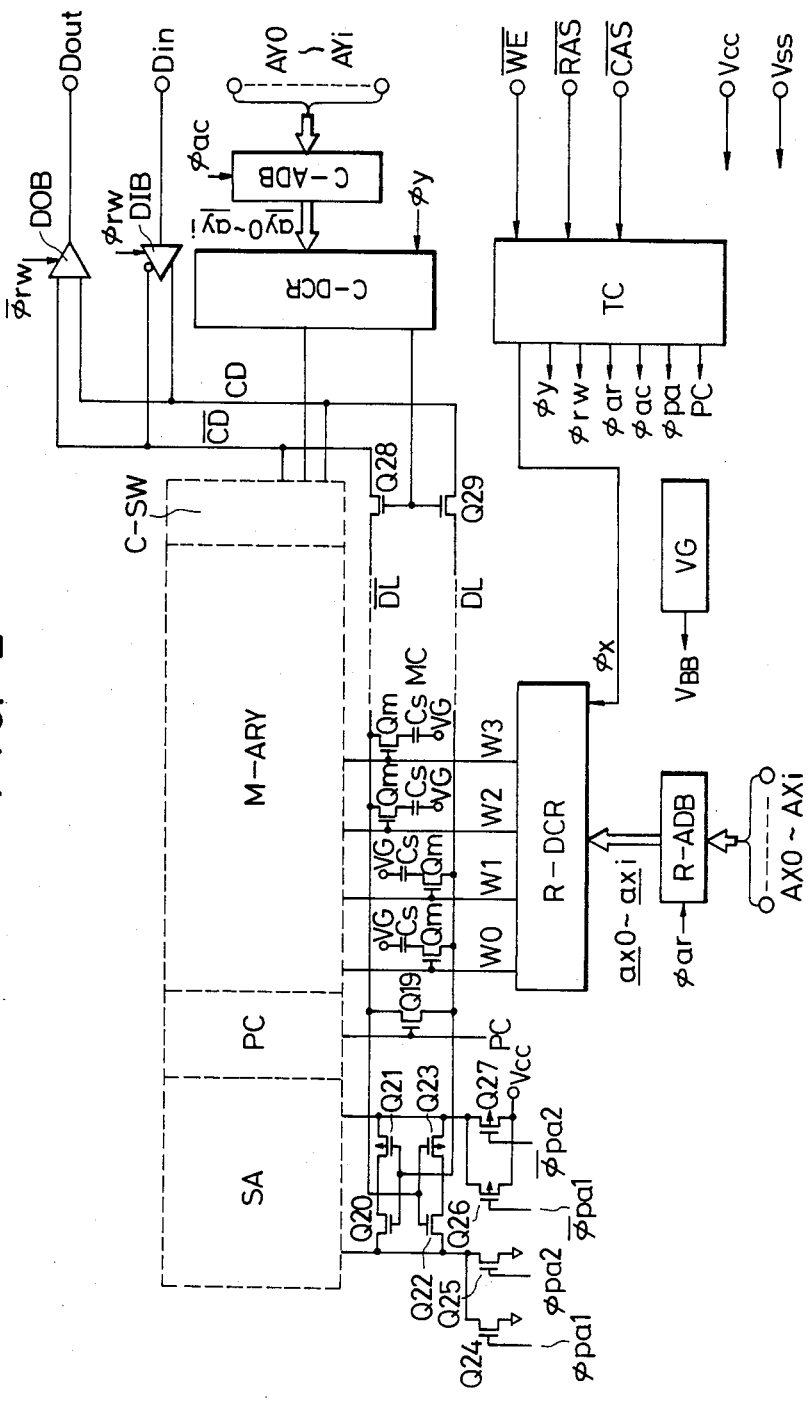
FIG. 2 is a block diagram showing an embodiment of the dynamic RAM which includes the booster circuit in FIG. 1.

FIG. 2 shows a block diagram of an embodiment of a dynamic RAM which includes a booster circuit according to this invention. Circuit elements and circuit blocks in the figure are formed on a single semiconductor substrate such as P⁻-type single-crystal silicon though this is not especially restrictive, by the use of known processes for manufacturing CMOS (complementary MOSFET) type semiconductor integrated circuits.

A memory cell MC of 1 bit comprises a storage capacitor $C_s$, and an address selecting N-channel MOSFET $Q_m$ which is connected in series therewith. Information of logic "1" or "0" is stored in the form of charges in the capacitor $C_s$. A fixed potential VG ($=\frac{1}{2}V_{cc}$) is applied to one electrode of the capacitor $C_s$.

Though not especially restricted, a memory array M-ARY is of the folded bit line organization. In FIG. 2, one pair of columns of the memory arrays are concretely illustrated. The input/output nodes of the respective memory cells MC are coupled to a pair of complementary data lines DL and $\overline{DL}$ arranged in parallel, in the state in which they are distributed with a predetermined regularity as shown in the figure.

A precharge circuit PC is constructed of an N-channel switching MOSFET interposed between the complementary data lines DL and $\overline{DL}$, such as a MOSFET Q19 illustrated representatively. As the result of a preceding read or write cycle, the potential of one of the complementary data lines is brought to the power source potential $V_{cc}$ and that of the other to the ground potential $V_{ss}$ by a sense amplifier SA. Before a succeeding cycle, the complementary data lines DL and $\overline{DL}$ are short-circuited through the MOSFET Q19 by the high level of a precharge signal PC which is formed by a timing control circuit TC. Thus, the precharge level $V_{cc}/2$ of the data lines DL, $\overline{DL}$ is obtained.

The sense amplifier SA comprises P-channel MOSFETs Q21, Q23 and N-channel MOSFETs Q20, Q22 which are representatively illustrated. More specifically, the sense amplifier SA is constructed of a CMOS latch circuit in which the inputs/outputs of a CMOS inverter composed of the MOSFETs Q20 and Q21 and a CMOS inverter composed of the MOSFETs Q22 and Q23 are coupled to each other, and the pair of input-/output nodes are respectively coupled to the complementary data lines DL and $\overline{DL}$. Although not especially restricted, the latch circuit is supplied with the power source potential $V_{cc}$ through P-channel MOSFETs Q26, Q27 in a parallel form and with the ground potential $V_{ss}$ of the circuitry through N-channel MOSFETs Q24, Q25 in a parallel form. These power switching MOSFETs Q24, Q25 and MOSFETs Q26, Q27 are used in common for latch circuits which are provided at other similar columns within the same memory mat. In other words, the P-channel MOSFETs and the N-channel MOSFETs in the latch circuits within the same memory mat have their sources connected in common respectively.

Complementary timing pulses $\phi_{pa1}$ and $\overline{\phi}_{pa1}$ which activate the sense amplifier SA in an operating cycle are respectively impressed on the gates of the MOSFETs Q24 and Q26, while complementary timing pulses $\overline{\phi}_{pa2}$ and $\overline{\phi}_{pa2}$ which lag over the timing pulses $\phi_{pa1}$ and $\overline{\phi}_{pa1}$ are respectively impressed on the gates of the MOSFETs Q25 and Q27. In this way, the operation of the sense amplifier SA is divided in two stages. When the timing pulses $\phi_{pa1}$ and $\overline{\phi}_{pa1}$ are generated, that is, when the first stage begins, a minute read voltage applied across the pair of data lines from the memory cell is amplified without undergoing an undesirable level fluctuation, owing to a current limiting function based on the MOSFETs Q24 and Q26 which have comparatively low conductances. The difference between the potentials of the complementary data lines is enlarged by the amplifying operation in the sense amplifier SA. Thereafter, when the timing pulses $\phi_{pa2}$ and $\overline{\phi}_{pa2}$ are generated, that is, when the second stage begins, the MOSFETs Q25 and Q27 having comparatively high conductances are brought into the "on" states. The amplifying operation of the sense amplifier SA is quickened owing to the "on" states of the MOSFETs Q25 and Q27. By effecting the amplifying operation of the sense amplifier SA in the two divided stages in this manner, data can be read out at high speed with the undesirable level changes of the complementary data lines prevented.

In a case where the potential applied from the memory cell MC to the data line DL is higher (lower) than the precharge voltage $V_{cc}/2$, the sense amplifier SA brings the above potential to the power source potential $V_{cc}$ (the ground potential $V_{ss}$). The differential amplification of the sense amplifier SA results finally in that one of the potentials of the complementary data lines DL and $\overline{DL}$ is the power source potential $V_{cc}$, while the other is the ground potential $V_{ss}$.

A row address decoder R-DCR forms selection signals for selecting one word line, and executes the addressing of the memory cells. That is, the row address decoder R-DCR decodes internal complementary address signals $ax_0$–$ax_i$ supplied from a row address buffer R-ADB to be described later and selects a predetermined word line in synchronism with a word line-selecting timing signal $\phi_x$.

The word line-selecting timing signal x is formed by a booster circuit (shown in FIG. 1) which is included in the timing control circuit TC to be described later. Since the timing signal $\phi_x$ has a voltage level higher than the power source potential $V_{cc}$, a high level for writing or rewriting information into the memory cell can be prevented from lowering, and in reading out information from the memory cell, signals can be transmitted to the data lines fast and efficiently.

The row address buffer R-ADB accept row address signals AX0–AXi supplied from external terminals $A_0$–$A_i$, in synchronism with a timing signal $\phi_{ar}$ formed in the timing control circuit TC on the basis of a row address strobe signal $\overline{RAS}$. From the address signals $AX_0$–$AX_i$, the row address buffer R-ADB forms internal address signals $ax_0$–$ax_i$ inphase with the address signals $AX_0$–$AX_i$ and internal address signals $\overline{ax_0}$–$\overline{ax_i}$ opposite in phase thereto (both the internal address signals shall be collectively termed the "internal complementary address signals $ax_0$–$ax_i$").

As seen from MOSFETs Q28 and Q29 illustrated representatively, a column switch C-SW selectively couples the complementary data lines DL, $\overline{DL}$ to common complementary data lines CD, $\overline{CD}$. The gates of these MOSFETs Q28 and Q29 are supplied with a selection signal from a column decoder C-DCR.

The column decoder C-DCR forms data line selection signals for selecting one data line, and supplies them to the column switch C-SW. That is, the column address decoder C-DCR decodes internal complementary address signals $ay_0$–$ay_i$ supplied from a column address buffer C-ADB to be described later and selects a predetermined data line in synchronism with a data line-selecting timing signal $\phi_y$.

The data line-selecting timing signal $\phi_y$ is formed in the timing control circuit TC. Unlike the timing signal $\phi_x$, this timing signal $\phi_y$ is not brought to a voltage level higher than the power source potential $V_{cc}$.

The column address buffer C-ADB accepts column address signals $AY_0$–$AY_i$ supplied from external terminals $A_0$–$A_i$, in synchronism with a timing signal $\phi_{ac}$ formed in the timing control circuit TC on the basis of a column address strobe signal $\overline{CAS}$. From the address signals $AY_0$–$AY_i$, the column address buffer C-ADB forms internal address signals $ay_0$–$ay_i$ inphase with the address signals $AY_0$–$AY_i$ and internal address signals $\overline{ay_0}$–$\overline{ay_i}$ opposite in phase thereto (both the internal address signals shall be collectively termed the "internal complementary address signals $ay_0$–$ay_i$").

In the reading operation, a data output buffer DOB is brought into an operating state by a timing signal $\overline{\phi}_{rw}$ and amplifies the output signal of a main amplifier included therein and receiving the signals of the common complementary data lines CD, $\overline{CD}$, the amplified signal being sent from an external (data output) terminal $D_{out}$. In the writing operation, the data output buffer DOB is brought into a high output impedance state by the timing rw. In this writing operation, a data input buffer DIB is brought into an operating state by a timing signal $\phi_{rw}$. In this writing operation, a data input buffer DIB is brought into an operating state by a timing signal $\phi_{rw}$ and sends the common complementary data lines CD, $\overline{CD}$ complementary write signals conforming to a write signal supplied from an external (data input) terminal $D_{in}$. Thus, data is written into the selected memory cell. Incidentally, in the reading operation, the data input buffer DIB is brought into a high output impedance state by the timing signal $\phi_{rw}$.

The timing control circuit TC receives the row address strobe signal $\overline{RAS}$, the column address strobe signal $\overline{CAS}$ and a write enable signal $\overline{WE}$ supplied from external terminals, and it forms the timing signals representatively exemplified above and also other various timing signals required for the memory operations.

A voltage generator circuit VG has a known arrangement, and produces a substrate bias potential $V_{BB}$ of minus sign from the power source potential $V_{CC}$ of plus sign supplied from an external terminal. The substrate bias potential $V_{BB}$ is fed to the $P^-$-type semiconductor substrate which is a body gate common to N-channel MOSFETs. P-channel MOSFETs are formed within an N⁻-type well region, which is fed with the power source potential $V_{CC}$ by way of example.

The word line bootstrap circuit (FIG. 1) is provided in order to achieve the "full write" into the capacitor $C_s$, in other words, in order to prevent the threshold voltages of the MOSFETs $Q_m$ etc. from incurring the level loss of the high level for writing data into the capacitor $C_s$, in the writing operation for the dynamic memory cell which comprises the MOSFET $Q_m$ and the capacitor $C_s$ as described above. Using a timing signal $dr_1$ and the delayed signal $dr_2$ thereof, this word line bootstrap circuit brings the high level of the word line-selecting timing signal $\phi_x$ to a level higher than the power source potential $V_{CC}$. That is, the high level of the signal $\phi_x$ is rendered a level which is higher than the operating voltage $V_{CC}$ of the IC supplied from the external terminal. In addition, the high level of the signal $\phi_x$ is rendered higher than the potential of greater absolute value between the two fixed potentials (namely, the potentials of a power source) supplied from the external terminals for the operations of the IC. In this embodiment, the high level of the signal $\phi_x$ is rendered higher than the potential $V_{CC}$ which is plus with respect to the ground potential $V_{SS}$. Alternatively, the high level of the signal $\phi_x$ is raised so that, in the address selecting N-channel MOSFET of the memory cell, the gate voltage may become higher than the drain voltage, the drain being the terminal through which the majority carriers leave.

Figure 1:
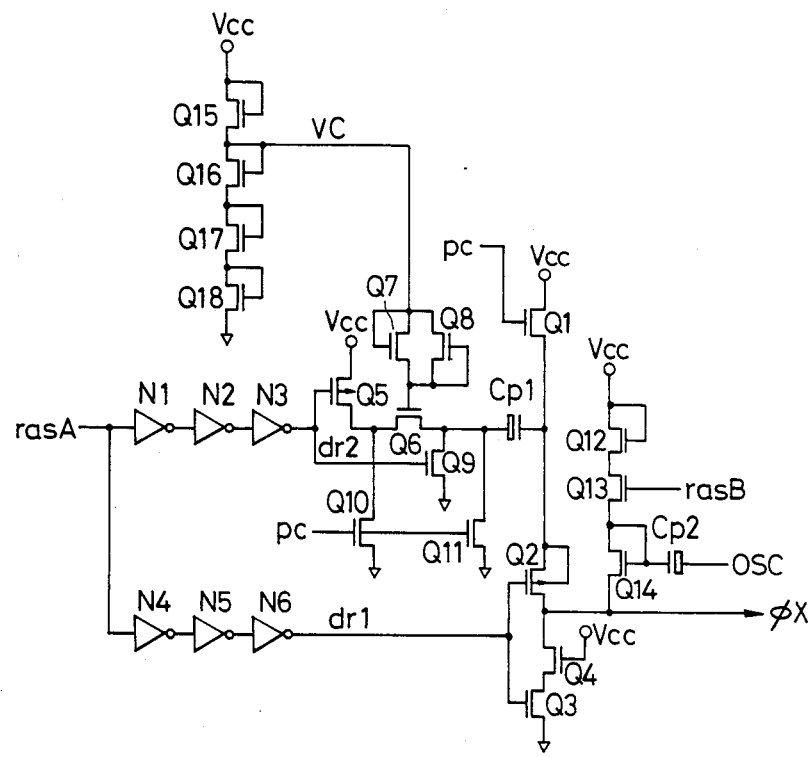
FIG. 1 is a circuit diagram showing an embodiment in the case where this invention is applied to a booster circuit for the word line-selecting timing signal generator of a dynamic RAM.

FIG. 1 shows a circuit diagram of one embodiment of the booster circuit which is included in the word line-selecting timing signal generator of the timing control circuit TC.

This booster circuit receives an internal timing signal rasA which is formed on the basis of the row address strobe signal $\overline{RAS}$ and which is inphase therewith, and L it forms the word line-selecting timing signal $\phi_x$ which is rendered the output voltage higher than the power source potential $V_{CC}$.

The internal timing signal rasA formed on the basis of the row address strobe signal $\overline{RAS}$ is transmitted to an odd number of inverter circuits N4–N6 in a series form for forming the delayed signal $dr_1$ of this timing signal. The timing signal rasA is also transmitted to an odd number of inverter circuits N1–N3 in a series form for forming the delayed signal $dr_2$ thereof. The delay time of a delay circuit constructed of the inverter circuits N1–N3 is set greater than that of a delay circuit constructed of the inverter circuits N4–N6.

The delayed signal $dr_2$ is supplied to the gate of a P-channel MOSFET Q5 and that of an N-channel MOSFET Q9. Upon receiving the delayed signal $dr_2$, the MOSFET Q5 transmits the power source potential $V_{CC}$ to the input side electrode of a boosting capacitor Cp1 through a level limiter MOSFET Q6. The capacitor Cp1 has the same structure as that of the capacitance element $C_s$ of the memory cell MC in this embodiment. The input side electrode of the capacitor Cp1 is, for example, an N-type semiconductor region formed in the P⁻-type semiconductor substrate, while the output side electrode thereof is, for example, a polycrystalline silicon film formed over the substrate. The structure of the capacitor Cp1 may be any of various known structures. The MOSFET Q9 is interposed between the input side electrode of the capacitor Cp1 and the ground potential point of the circuitry. The gate of the MOSFET Q6 is supplied with a reference voltage VC through an N-channel MOSFET Q7 in a diode form. In order to limit the gate voltage of the MOSFET Q6 with the reference voltage (fixed voltage) VC, the gate of the MOSFET Q6 is furnished with an N-channel MOSFET Q8 in a diode form for causing current to flow toward the reference voltage VC. This reference voltage VC is formed by N-channel MOSFETs Q15–Q18 in a series form which are interposed between the power source potential $V_{CC}$ and the ground potential of the circuitry. The MOSFET Q15 is made sufficiently low in conductance than the other MOSFETs Q16 thru Q18, and each of the MOSFETs Q16–Q18 is endowed with a threshold voltage $V_{th}$. Thus, the reference voltage VC is set at the fixed voltage which is the combined threshold voltage (3 $V_{th}$) of the MOSFETs Q16 thru Q18 in the series form. This reference voltage VC can be set at a different value by changing the number of MOSFETs to be connected in series. Resetting N-channel MOSFETs Q10 and Q11 are disposed between both the ends of the level limiting MOSFET Q6 and the ground potential of the circuitry. The gates of these MOSFETs Q10 and Q11 are supplied with a precharge signal pc.

A precharging MOSFET Q1 is interposed between the output side electrode of the boosting capacitor Cp1 and the power source potential $V_{CC}$. The gate of this MOSFET Q1 is supplied with the precharge signal pc which becomes a high level when the dynamic RAM is in the unselected state thereof (when the signal $\overline{RAS}$ is at the high level). A voltage derived from the output side electrode of the boosting capacitor Cp1 is supplied to the source of a MOSFET Q2 as the operating supply voltage of an outputting CMOS inverter circuit which is constructed of the P-channel MOSFET Q2 and an N-channel MOSFET Q3. The word line-selecting timing signal $\phi_x$ is output from the drain of the MOSFET Q2. Intervening between the MOSFETs Q2 and Q3 is an N-channel MOSFET Q4 which has its gate steadily supplied with the power source potential $V_{CC}$ in order to prevent the boosted word line selection timing signal $\phi_x$ from being impressed on the drain of the N-channel MOSFET Q3. Thus, the destruction of the gate insulator film of the MOSFET Q3 and the generation of hot carriers are suppressed.

Although not especially restricted, an N-type well region in which the P-channel MOSFET Q2 is formed, in other words, the channel region of the MOSFET Q2 is coupled to the source electrode of this MOSFET Q2 (the other electrode side of the bootstrap capacitor Cp1) unlike the channel regions of the other P-channel MOSFETs. Thus, a voltage at the same level as that of the boosted timing signal $\phi_x$ is applied to the channel of the MOSFET Q2, so that the boosted timing signal $\phi_x$ can be output fast.

Although no special restriction is intended, a voltage replenishment circuit which is constructed of N-channel MOSFETs Q12–Q14 and a boosting capacitor Cp2 is interposed between the power source potential $V_{CC}$ and the drain of the MOSFET Q2, namely, the output terminal ($\phi_x$) of the booster circuit. This voltage replenishment circuit is brought into its operating state by an internal timing signal rasB which is delayed for a predetermined time with respect to the internal timing signal rasA, and it feeds the output terminal $\phi_x$ with a high voltage based on the boosting capacitor Cp2 which receives an oscillation signal OSC.

The oscillation signal OSC is the oscillation output of an oscillator circuit constituting the substrate bias voltage generator VG though not especially restricted. To this end, the voltage generator VG has, for example, an arrangement disclosed in U.S. patent application Ser. No. 763,615 cited as a reference in this specification and supplies the predetermined signal to the boosting capacitor Cp2. When the oscillation signal OSC is at a low level, the capacitor Cp2 is precharged through the MOSFETs Q12 and Q13. The boosted voltage which is generated at the output side electrode of the capacitor Cp2 by bringing the oscillation signal OSC to a high level, is transmitted to the output terminal ($\phi_x$) of the booster circuit through the MOSFET Q14. The capacitor Cp2 has its capacitance made small, thereby to have a current supplying ability to the extent of compensating an amount in which the level of the output voltage of the booster circuit, in other words, that of the voltage at the output side electrode of the boosting capacitor Cp1 is lowered by a leakage current. Thus, during the selected state of the dynamic RAM, the voltage level of the word line selection timing signal $\phi_x$ is prevented from lowering due to leakage etc.

The timing signal $\phi_x$ is supplied to the row address decoder R-DCR as shown in FIG. 2.

Figure 3:
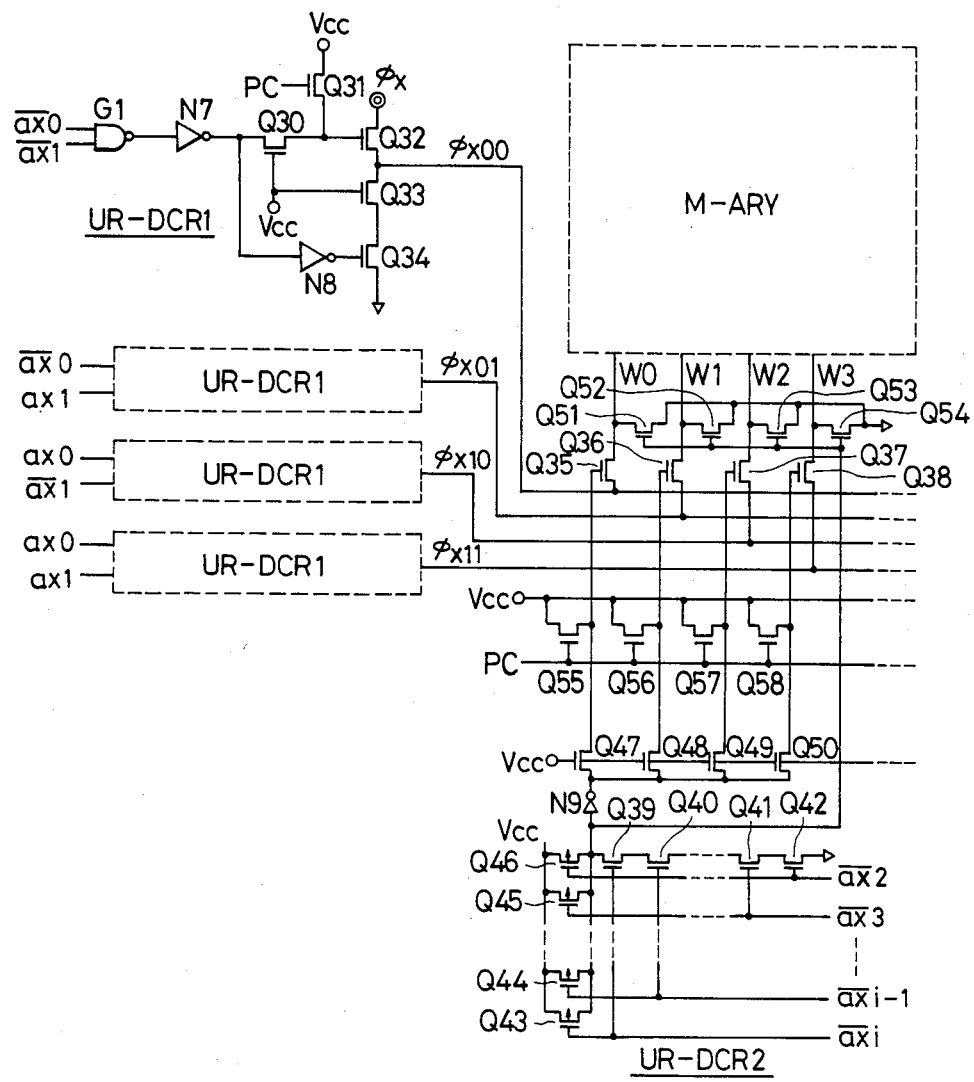
FIG. 3 is a circuit diagram showing the word line selector circuit of the dynamic RAM in FIG. 2.

FIG. 3 shows a circuit diagram of one embodiment of the row address decoder R-DCR. Although not especially restricted, the row address decoder R-DCR is constructed of the combination of row decoders R-DCR1 and R-DCR2. In FIG. 3, one unit circuit of the first decoder R-DCR1 as well as the second decoder R-DCR2 is shown representatively. The circuit illustrated in FIG. 3 is a circuit corresponding to four word lines (W0-W3).

By dividing the row address decoder in two, the pitch (interval) of the signal lines of the second row decoder R-DCR2 and the pitch of the word lines can be equalized. As a result, no wasteful space appears on the semiconductor substrate.

The first decoder R-DCR1 forms four sorts of word line selection timing signals $\phi_{x00}\phi_{x01}$, $\phi_{x10}$ and $\phi_{x11}$ on the basis of the internal complementary address signals of 2 bits $ax_0$ and $ax_1$. Although no special restriction is meant, the timing signal $\phi_{00}$ is brought to the high level in synchronism with the timing signal $\phi_x$ when the address signals $ax_0$ and $ax_1$ are at the low level (the address signals $\overline{ax_0}$ and $\overline{ax_1}$ are at the high level). Likewise, the timing signals $\phi_{x01}$, $\phi_{x10}$ and $\phi_{x11}$ are respectively brought to the high level in synchronism with the timing signal $\phi_x$ when the address signals $\overline{ax_0}$ and $ax_1$, $ax_0$ and $\overline{ax_1}$, and $\overline{ax_0}$ and $\overline{ax_1}$ are at the high level.

By way of example, the internal address signals $\overline{ax_0}$ and $\overline{ax_1}$ are applied to the 2-input NAND gate G1 of the unit circuit of the first decoder. The output of the gate G1 is supplied, on one hand, to the gate of an Nchannel MOSFET Q32 through a CMOS inverter N7 as well as an N-channel MOSFET Q30, and on the other hand, to the gate of an N-channel MOSFET Q34 through the CMOS inverter N7 as well as a CMOS inverter N8. Accordingly, the MOSFETs Q32 and Q34 connected in series between the ground potential and a terminal to which the timing signal $\phi_x$ is applied perform complementary switching operations. Thus, when both the signals $\overline{ax_0}$ and $\overline{ax_1}$ are at the high level, the signal $\phi_{x00}$ becomes the high level in accordance with the high level of the timing signal $\phi_x$. In advance of this, an N-channel MOSFET Q31 precharges the gate potential of the MOSFET Q32 to $V_{CC}-V_{th}$ (where $V_{th}$ denotes the threshold voltage of the MOSFET Q31) in the unselected period of the chip, namely, the high level period of the precharge signal PC. An N-channel MOSFET Q33 whose gate is supplied with the power source potential $V_{CC}$ is connected in series between the MOSFETs Q32 and Q34, whereby the high potential of the signal $\phi_x$ is prevented from being directly applied to the drain of the MOSFET Q34. Thus, the destruction of a gate insulator film etc. and the generation of hot carriers in the MOSFET Q34 are suppressed.

The unit circuits UR-DCR1 for the signals $\phi_{x01}-\phi_{x11}$ are arranged and operated similarly to the above.

The word line selection timing signals $\phi_{x00}$, $\phi_{x01}$, $\phi_{x10}$ and $\phi_{x11}$ converted in the four ways are respectively transmitted to the word lines W0, W1, W2 and W3 of the memory array M-ARY through transfer gate MOSFETs Q35, Q36, Q37 and Q38. The gates of the MOSFETs Q35, Q36, Q37 and Q38 are supplied with the output signal of one unit circuit UR-DCR2 of the second decoder R-DCR2 in common.

The respective unit circuits of the second decoder are supplied with the remaining internal address signals $ax_2-ax_i$ in predetermined combinations, for example, in the combination of the signals $\overline{ax_2}-\overline{ax_i}$. The unit circuit UR-DCR2 is constructed of N-channel MOSFETs Q39-Q42 which are all connected in series and P-channel MOSFETs Q43-Q46 which are connected in parallel with one another, and whose gates receive the signals $\overline{ax_2}-\overline{ax_i}$ respectively. This CMOS circuit functions as a NAN gate, and forms the selection signals of the four word lines (W0-W3). The output of this NAND circuit is invertedby a CMOS inverter N9, the output of which is transmitted to the gates of the transfer gate MOSFETs of the N-channel type Q35-Q38 as switching circuits through cutting MOSFETs of the N-channel type Q47-Q50. The gates of the cutting MOSFETs Q47-Q50 have the power source potential $V_{CC}$ impressed thereon. In addition, although no special restriction is intended, discharge MOSFETs Q51-Q54 are interposed between the respective word lines and the ground potential $V_{SS}$, and the gates thereof are supplied with the output of the NAND circuit.

Precharge MOSFETs Q55-Q58 are interposed between the gates of the respective transfer gate MOSFETs Q35 -Q38 and the power source potential $V_{CC}$. Thus, the gate potentials of the transfer gate MOSFETs Q35-Q38 are precharged to $V_{CC}-V_{th}$ (where $V_{th}$ denotes the threshold voltage of each of the MOSFETs Q55-Q58) by the high level of the precharge signal PC and prior to the selection of the word line W.

Figure 4:
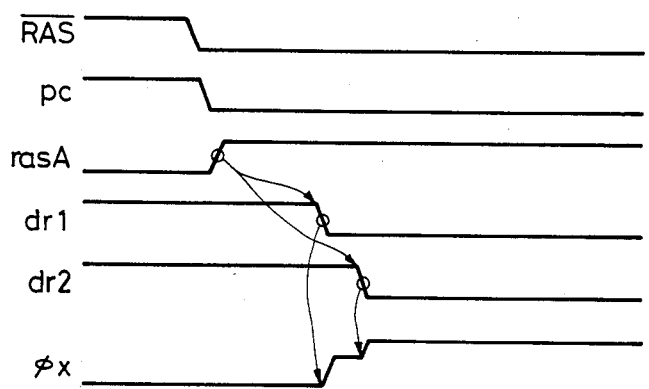
FIG. 4 is a timing chart for explaining the operation of the circuit in FIG. 1.

The operation of this embodiment is fundamentally the same as that of the known dynamic RAM. Accordingly, the operation of the booster circuit in FIG. 1 and the operation of selecting the word line will be chiefly described with reference to FIG. 4.

When the dynamic RAM is in the unselected state, the row address strobe signal $\overline{RAS}$ and the precharge signal pc are held at the high levels. Therefore, the MOSFETs Q10 and Q11 and the precharge MOSFET Q1 are brought into the "on" states, and the boosting capacitor Cp1 is precharged to the potential $V_{CC}-V_{th}$ (where $V_{CC}$ denotes the power source potential, and $V_{th}$ the threshold voltage of the MOSFET Q1). Charges stored in the connection node between the MOSFETs Q5 and Q6 are discharged by the MOSFET Q10. Owing to the low level of the internal signal rasA responsive to the high level of the signal $\overline{RAS}$, the MOSFETs Q5 and Q2 are brought into the "off" states, and the MOSFETs Q9 and Q3 into the "on" states. Accordingly, the word line selection timing signal $\phi_x$ is brought to the low level.

The MOSFETs Q31 and Q55-Q58 are similarly brought into the "on" states by the high level of the signal pc. Thus, the low level of the signal $\phi_x$ is supplied to the respective word lines W0-W3 through the MOSFET Q32 and MOSFETs Q35-Q38.

When the dynamic RAM is set at the selected state, the precharge signal pc is responsively brought to the low level, by which the MOSFETs Q10 and Q11 and the precharge MOSFET Q1 are brought into the "off" states. The dynamic RAM is brought into the selected state by the low level of the row address strobe signal $\overline{RAS}$, and the row-group internal timing signal rasA is brought to the high level by this low level. Owing to the high level of the internal timing signal rasA, the delayed signal $dr_1$ thereof becomes the low level earlier, so that the MOSFET Q2 falls into the "on" state and the MOSFET Q3 into the "off" state. Owing to the "on" state of the MOSFET Q2, the word line selection timing signal $\phi_x$ rises to the high level ($V_{CC}-V_{th}$) conforming to the precharge voltage ($V_{CC}-V_{th}$) of the boosting capacitor Cp1. When the delayed signal $dr_2$ becomes the low level later than the delayed signal $dr_1$, the MOSFET Q5 falls into the "on" state and forms the input signal which rises to the power source potential $V_{CC}$. The MOSFET Q6, however, has its gate supplied with the reference voltage $VC-V_{th}$ (where $V_{th}$ denotes the threshold voltage of the MOSFET Q7) and is thus brought into the "on" state. On account of the signal of the high level transmitted by the "on" state of the MOSFET Q5, the MOSFET Q6 undergoes self-bootstrapping, and the gate voltage thereof is about to rise. Since, however, the MOSFET Q8 is provided, the gate voltage of the MOSFET Q6 is clamped to a level of $VC+V_{th}$ (where $V_{th}$ denotes the threshold voltage of the MOSFET Q8). Accordingly, the signal of the high level to be transmitted to the input side electrode of the boosting capacitor Cp1 through the MOSFET Q6 is limited to the voltage VC obtained by subtracting the threshold voltage $V_{th}$ of this MOSFET from the gate voltage thereof. Therefore, the boosted voltage with the precharge voltage ($V_{CC}-V_{th}$) added to the above voltage VC is provided at the output side electrode of the boosting capacitor Cp1. When the reference voltage VC is about 3 $V_{th}$ as described before, the boosted voltage becomes approximately $V_{CC}+2 V_{th}$. Thus, the signal $\phi_x$ has the high level voltage brought to the still higher voltage ($V_{CC}+2 V_{th}$) The output voltage of the booster circuit is determined independently of the ability of the booster circuit, that is, the boosted voltage produced by applying the power source potential across both the electrodes of the capacitor Cp1 at the predetermined timing. In other words, the output of the booster circuit is made lower than the boosting ability thereof.

Owing to such limitation of the boosted voltage, the circuit elements (the MOSFETs Q12-Q14 and the MOSFETs of the decoder UR-DCR1) disposed on the output side of the booster circuit can be prevented from being destroyed by high voltages. Also the circuit elements (the MOSFETs Q2-Q4) constituting the booster circuit can be prevented from being destroyed. Since the MOSFET Q6 which is a circuit element for performing the voltage limitation as stated above is subjected to the low voltage less than the power source potential, it is free from the fear of destruction.

In synchronism with the fall of the signal $\overline{RAS}$ to the low level, the row address signals $AX_0-AX_i$ are accepted, and the internal address signals $ax_0-ax_i$ are formed.

In a case where the internal address signals $\overline{ax_0}$ and $\overline{ax_1}$ are at the high levels, one word line selection timing signal $\phi_{x00}$ rises to the high level in synchronism with the high level of the word line selection timing signal $\phi_x$. On this occasion, the channel of the MOSFET Q32 is brought to the high level of the signal $\phi_{x00}$, so that the gate voltage having already been precharged to the high level is raised to the high level by the self-bootstrapping. Thus, the signal $\phi_{x00}$ is transmitted to the MOSFET Q35 without any level loss (as boosted to the level of the signal $\phi_x$). Notwithstanding that the MOSFET Q30 has its gate supplied with the power source potential $V_{CC}$ by the raised gate voltage of the MOSFET Q32 at this time, it is brought into the "off" state. Owing to the "off" state of the MOSFET Q30 thus established, the raised voltage can be prevented from lowering on account of the sharing of charges with a parasitic capacitance on the unit circuit side.

Since the boosted level of the signal $\phi_x$ is limited, the destruction of the gate insulator films of the MOSFETs Q32 and Q33 can be prevented. In addition, similar destruction in the MOSFET Q34, the generation of hot carriers, etc. can be prevented by the limitation of the level of the signal $\phi_x$ and the MOSFET Q33.

Meanwhile, the outputs $\phi_{x01}-\phi_{x11}$ of the unselected unit circuits UR-DCR1 of the first decoder are brought to the low levels. Since, at this time, each of MOSFETs corresponding to the MOSFET Q32 is brought into the "off" state, a high voltage (the level of the signal $\phi_x$ as it is) is applied across the gate and drain thereof, and also a high voltage (the sum between the absolute value of the high level potential of the signal $\phi_x$ and that of the substrate bias potential $V_{BB}$) is applied across the drain and the substrate. Since, however, the boosted level of the signal $\phi_x$ is limited in this embodiment, the destruction of the gate insulator film and the breakdown of the junction of the MOSFET corresponding to the MOSFET Q32 can be prevented.

In a case where the internal address signals $\overline{ax_2}-\overline{ax_i}$ are at the high levels, the output of one unit circuit UR-DCR2 of the second decoder is brought to the low level. Thus, the MOSFETs Q51-Q54 are brought into the "off" states, and the gates of the MOSFETs Q35-Q38 are supplied with the high level. Then, the signals $\phi_{x00}-\phi_{x01}$ are respectively transmitted to the word lines W0-W3. That is, the word lines W1-W3 are set at the low levels. Meanwhile, in the MOSFET Q35, an operation similar to the self-bootstrapping in the MOSFET Q32 arises, so that the signal $\phi_{x00}$ is transmitted to the word line W0 without any level loss. As a result, the boosted signal $\phi_x$ is transmitted to the selected word line W0 without any level loss. On this occasion, the MOSFET Q47 effects the same function as that of the MOSFET Q30. D 15 Since the boosted level of the signal $\phi_x$ is limited, the destruction of the gate insulator films and the breakdown of the junctions of the MOSFETs Q35 can be prevented.

Meanwhile, the outputs of the unselected unit circuits UR-DCR2 of the second decoder are brought to the high levels. Since, at this time, each of MOSFETs corresponding to the MOSFET Q35 is brought into the "off" state, the high voltage (the level of the signal $\phi_x$ as it is) is applied across the gate and drain thereof, and also the high voltage (the sum between the absolute value of the potential of the signal $\phi_x$ and that of the substrate bias potential $V_{BB}$) is applied across the drain and the substrate. Since, however, the boosted level of the signal $\phi_x$ is limited in this embodiment, the destruction of the gate insulator film and the breakdown of the junction of the MOSFET corresponding to the MOSFET Q35 can be prevented. Owing to the turn-on of the MOSFETs Q51–Q54, the word lines W are held at the ground potential while not selected.

The column address strobe signal $\overline{CAS}$ (not shown) falls with a delay of a predetermined time since the fall of the signal $\overline{RAS}$. On the basis of the address signals $AY_0$–$AY_i$ accepted in synchronism with this strobe signal, one column switch, for example, the MOSFETs Q28 and Q29 are selected. Thus, the pair of complementary data lines DL and $\overline{DL}$ are connected to the common data lines CD and $\overline{CD}$.

The input buffer DIB or output buffer DOB is brought into the operating state in accordance with the low level or high level of the write enable signal $\overline{WE}$. Thus, data supplied to the data input terminal $D_{in}$ is written into the selected memory cell MC, or data in the selected memory cell MC is delivered to the data output terminal $D_{out}$.

According to this invention, the following effects are attained:

(1) The output signal of a booster circuit is set at a voltage which is greater than a power source potential and which is less than a predetermined value. Thus, circuit elements which receive the output signal of the booster circuit can be prevented from being destroyed.

(2) A signal of limited voltage value is used for obtaining the raised output voltage of the booster circuit. Thus, the level of the output voltage can be reliably limited.

(3) An input signal of limited level is supplied to the input side electrode of a boosting capacitor which constitutes the booster circuit, whereby an output voltage to be provided from the output side electrode of the capacitor can be limited to a predetermined potential. Thus, a circuit element for level limitation is supplied with only the low voltage less than the power source potential and can therefore be prevented from being destroyed.

(4) Owing to the above item (3), a semiconductor integrated circuit device of high reliability having a widened operating voltage range can be provided.

Although, in the above, the invention made by the inventors has been concretely described on the basis of embodiments, it is needless to say that this invention is not restricted to the foregoing embodiments but that it can be variously altered within a scope not departing from the purport thereof.

Figure 5:
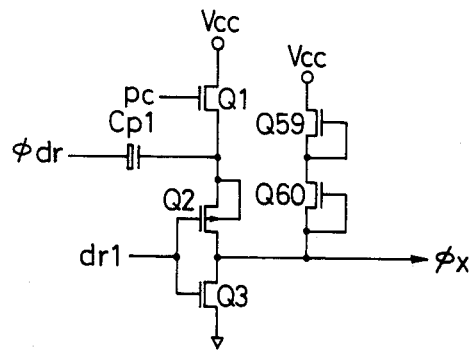
FIG. 5 is a circuit diagram showing the booster circuit of the word line-selecting timing generator of a dynamic RAM in another embodiment of this invention.

By way of example, a circuit shown in FIG. 5 ay well be used for forming the word line selection timing signal $\phi_x$ which is rendered greater than the power source potential $V_{cc}$ and less than the predetermined voltage. With the booster circuit of FIG. 5, when a boost signal $\phi dr$ which is supplied to the input side electrode of a boosting capacitor Cp1 is at its low level, that is, when the dynamic RAM is in the unselected state, the output side electrode of the boosting capacitor Cp1 is precharged to the power source potential $V_{CC}-V_{th}$ through a precharge MOSFET Q1. That is, the high level of the precharge signal pc brings the MOSFET Q1 into the "on" state, which precharges the boosting capacitor Cp1 to the potential $V_{CC}-V_{th}$. When the dynamic RAM is brought into the selected state and the boost signal dr becomes its high level, the potential of the output side electrode of the boosting capacitor Cp1 is raised to a voltage which is approximately double $(2V_{cc}-V_{th})$ the power source potential $V_{CC}$ and the signal $\phi_x$ whose level is higher than the power source potential is obtained. In order to limit the high level of the signal $\phi_x$, voltage limitation means is disposed on the output side of the booster circuit in this example. That is, an output voltatge level limiter circuit comprising MOSFETs Q59 and Q60 in a diode form is disposed as shown in FIG. 5. Thus, the high level of the signal $\phi_x$ is limited to $V_{CC}+2 V_{th}$ (where $V_{th}$ denotes the threshold voltage of each of the MOSFETs Q59 and Q60). The value of the high level of the signal $\phi_x$ can be changed by changing the number of MOSFETs in the diode form.

The circuit of the embodiment in FIG. 1 can be variously modified. By way of example, the circuit for forming the reference voltage VC may well be one which forms the fixed voltage only in the selected state of the chip for the purpose of reducing the current consumption thereof. To this end, for example, a P-channel MOSFET whose gate receives a signal in same phase to the signal pc is interposed between the power source potential $V_{CC}$ and the MOSFET Q15. The means for generating the reference voltage VC may be any of various known devices. This reference voltage VC may well be one which can be adjusted to a suitable level according to the characteristic of a product by the use of fuse means or the like. Moreover, the voltage replenishment circuit at the output terminal of the booster circuit may well be omitted in a case where the boosted output timing signal is to be generated for a comparatively short period, or in a case where the level lowering of the timing signal poses no problem. The arrangement of the delay circuit, the peripheral circuits of the boosting capacitor, etc. can adopt various aspects.

In the circuit of FIG. 1, the voltage limitation means which is provided on the input side of the booster circuit (the boosting capacitor Cp1) can be variously modified. By way of example, the level limitation of a substantial input voltage may well be effected in such a way that, at the precharge operation by the MOSFET Q1, a voltage higher than the ground potential of the circuitry is applied to the input side electrode of the boosting capacitor Cp1. Further, the voltage to be precharged to the output side electrode of the boosting capacitor Cp1 by the MOSFET Q1 may well be limited to a predetermined voltage level by a proper voltage limiter circuit.

The booster circuit may be any insofar as it produces a voltage higher than the power source potential in such a way that the boosting capacitor is precharged beforehand, whereupon an input voltage whose level is substantially limited is applied thereto.

This invention is effective for a booster circuit for the potential of a word line in another semiconductor memory, for example, a static RAM.

This invention is applicable, not only to semiconductor memories, but also to any semiconductor integrated circuit device which includes a booster circuit employing a boosting capacitor. Further, this invention is applicable to any semiconductor integrated circuit device which includes a booster circuit not employing a boosting capacitor.

What is claimed is:

1. A semiconductor integrated circuit device comprising:
    an output node;

a boost capacitor having a first terminal and a second terminal, wherein said second terminal is coupled to said output node;

a voltage supply terminal to which a first voltage is supplied;

precharge means coupled between said second terminal of said boost capacitor and said voltage supply terminal, and for precharging said boost capacitor at a predetermined precharge voltage;

clock providing means for providing a clock signal; and voltage limitation means for providing a predetermined voltage less than said first voltage to said first terminal of said boost capacitor in response to said clock signal.

2. A semiconductor integrated circuit device according to claim 1, wherein said voltage limitation means comprises a MOSFET coupled to receive said clock signal at one electrode thereof and for providing said predetermined voltage from another electrode thereof, wherein a gate of said MOSFET is coupled to a voltage generating means.

3. A semiconductor integrated circuit device according to claim 2, further comprising control means coupled between a gate of said MOSFET and said voltage generating means.

4. A semiconductor integrated circuit device according to claim 3, wherein said voltage generating means comprises a first voltage generating means coupled between said control means and a third terminal to which said first voltage is supplied, and a second voltage generating means coupled between said control means and a fourth terminal to which a second voltage is supplied.

5. A semiconductor integrated circuit device according to claim 4, wherein said first voltage is higher than said second voltage.

6. A semiconductor integrated circuit device according to claim 3, wherein said control means comprises a first diode and a second diode wherein a first input terminal of said first diode is coupled to a second output terminal of said second diode and a first output terminal of said first diode is coupled to a second input terminal of said second diode, wherein said first input terminal of said first diode is coupled to said voltage limitation means and said first output terminal of said first diode is coupled to said gate of first MOSFET.

7. A semiconductor integrated circuit device according to claim 6, wherein said first diode and said second diode are constructed of a MOSFET, respectively.

8. A semiconductor integrated circuit device according to claim 2, wherein said voltage generating means comprises a first voltage generating means coupled between said gate of said MOSFET and a third terminal to which said first voltage is supplied, and a second voltage generating means coupled between said gate of said MOSFET and a fourth terminal to which a second voltage is supplied.

9. A semiconductor integrated circuit device according to claim 8, wherein said first voltage is higher than said second voltage.

10. A semiconductor integrated circuit device according to claim 1, wherein said precharge means includes at least one MOSFET.

11. A semiconductor integrated circuit device comprising:

an output node for providing an output voltage greater than a predetermined reference voltage;

a boost capacitor having a first terminal and a second terminal, wherein said second terminal is coupled to said output node;

a third terminal to which said reference voltage is supplied;

precharge means coupled between said second terminal of said boost capacitor and said third terminal, and for precharging said boost capacitor;

signal providing means for providing a signal; and voltage limitation means coupled to said signal providing means and for limiting a voltage which is supplied to said first terminal in response to said signal to a predetermined voltage less than said reference voltage.

12. A semiconductor integrated circuit device according to claim 11, wherein said voltage limitation means comprises a MOSFET coupled to receive said signal at one electrode and for providing said predetermined voltage from another electrode thereof, wherein a gate of said MOSFET is coupled to a voltage generating means.

13. A semiconductor integrated circuit device according to claim 12, further comprising control means coupled between a gate of said MOSFET and said voltage generating means.

14. A semiconductor integrated circuit device according to claim 13, wherein said voltage generating means comprises a first voltage generating means coupled between said control means and a third terminal to which said reference voltage is supplied, and a second voltage generating means coupled between said control means and a fourth terminal to which a second voltage is supplied.

15. A semiconductor integrated circuit device according to claim 14, wherein said reference voltage is greater than said second voltage.

16. A semiconductor integrated circuit device according to claim 13, wherein said control mean comprises a first diode and a second diode, wherein a first input terminal of said first diode is coupled to a second output terminal of said second diode and a first output terminal of said first diode is coupled to a second input terminal of said second diode, wherein said first input terminal of said first diode is coupled to said voltage limitation means and said first output terminal of said first diode is coupled to said gate of said MOSFET.

17. A semiconductor integrated circuit device according to claim 16, wherein said first diode and said second diode are constructed of a MOSFET, respectively.

18. A semiconductor integrated circuit device according to claim 12, wherein said voltage generating means comprises a first voltage generating means coupled between said gate of said MOSFET and a third terminal to which said reference voltage is supplied, and a second voltage generating means coupled between said gate of said MOSFET and a fourth terminal to which a second voltage is supplied.

19. A semiconductor integrated circuit device according to claim 18, wherein said reference voltage is greater than said second voltage.

20. A semiconductor integrated circuit device according to claim 11, wherein said precharge means is constructed of at least one MOSFET.

21. A semiconductor integrated circuit device comprising:

a memory array which includes a plurality of word lines, a plurality of data lines, and a plurality of memory cells coupled in correspondence with said word lines and said data lines, respectively, first selection means for selecting a predetermined word line;

second selection means for selecting a predetermined data line; and voltage generation means for supplying an output voltage to said first selection means, whereby a potential of the selected word line is set substantially at said output voltage, wherein said voltage generation means comprises:
clock providing means for providing a clock signal,
switching means for providing said output voltage in response to said clock signal,
a boost capacitor having a second terminal and a first terminal coupled to said switching means,
a terminal to which a first voltage is supplied,
precharge means coupled between said first terminal of said boost capacitor and said terminal, and for precharging said boost capacitor at a predetermined precharge voltage, and
voltage limitation means for providing a predetermined voltage less than said first voltage to said second terminal of said boost capacitor in response to said clock signal.

22. A semiconductor integrated circuit device according to claim 21, wherein said each memory cell includes a MOSFET and a capacitor element connected thereto.

23. A semiconductor integrated circuit device according to claim 21, wherein said first selection means comprises a first selector circuit and a second selector circuit, and MOSFETs which are coupled between said first selector circuit and said word lines and whose gates are supplied with an output of said second selector circuit, and wherein said output voltage of said voltage generation means is supplied to said first selector circuit.

24. A semiconductor integrated circuit device according to claim 21, wherein said voltage limitation means comprises a MOSFET coupled to receive said clock signal at one electrode and for providing said predetermined voltage from another electrode thereof, and wherein a gate of said MOSFET is coupled to a voltage generating means.

25. A semiconductor integrated circuit device according to claim 24, further comprising control means coupled between a gate of said MOSFET and said voltage generating means.

26. A semiconductor integrated circuit device according to claim 25, wherein said voltage generating means comprises a first voltage generating means coupled between said control means and a third terminal to which said first voltage is supplied, and a second voltage generating means coupled between said control means and a fourth terminal to which a second voltage is supplied.

27. A semiconductor integrated circuit device according to claim 26, wherein said first voltage is higher than said second voltage.

28. A semiconductor integrated circuit device according to claim 25, wherein said control means comprises a first diode and a second diode, wherein a first input terminal of said first diode is coupled to a second output terminal of said second diode and a first output terminal of said first diode is coupled to a second input terminal of said second diode, wherein said first input terminal of said first diode is coupled to said voltage limitation means and said first output terminal of said first diode is coupled to said gate of said MOSFET.

29. A semiconductor integrated circuit device according to claim 28, wherein said first diode and said second diode are constructed of MOSFET, respectively.

30. A semiconductor integrated circuit device according to claim 24, wherein said voltage generating means comprises a first voltage generating means coupled between said gate of said MOSFET and a third terminal to which said first voltage is supplied, and a second voltage generating means coupled between said gate of said MOSFET and a fourth terminal to which a second voltage is supplied.

31. A semiconductor integrated circuit device according to claim 30, wherein said first voltage is higher than said second voltage.

32. A semiconductor integrated circuit device according to claim 21, wherein said precharge means is constructed of at least one MOSFET.

33. A semiconductor integrated circuit device according to claim 21, wherein said switching means is constructed of a complementary MOSFET.

34. A semiconductor integrated circuit device comprising:

a memory array which includes a plurality of word lines, a plurality of data lines, and a plurality of memory cells coupled in correspondence with said word lines and said data lines, respectively, first selection means for selecting a predetermined word line;

second selection means for selecting a predetermined data line; and voltage generation mean for supplying an output voltage to said first selection means, whereby a potential of the selected word line is set substantially at said output voltage, wherein said voltage generation means comprises:
signal providing means for providing a signal,
switching means for providing said output voltage greater than a predetermined reference voltage in response to said signal,
a boost capacitor having a first terminal and a second terminal, said second terminal being coupled to said switching means,
a third terminal to which said reference voltage is supplied,
precharge means coupled between said second terminal of said boost capacitor and said third terminal, and for precharging said boost capacitor, and
voltage limitation means coupled to said signal providing means and for limiting a voltage which is supplied to said first terminal in response to said signal to a predetermined voltage less than said reference voltage.

35. A semiconductor integrated circuit device according to claim 34, wherein said each memory cell includes a MOSFET and a capacitance element connected thereto.

36. A semiconductor integrated circuit device according to claim 34, wherein said first selection means comprises a first selector circuit, a second selector circuit and MOSFETs which are coupled between said first selector circuit and said word lines an whose gate are supplied with an output of said second selector circuit, and wherein said output voltage of said voltage generation means is supplied to said first selector circuit.

37. A semiconductor integrated circuit device according to claim 34, wherein said voltage limitation means comprises a MOSFET coupled to receive said signal at one electrode and for providing said predetermined voltage from another electrode thereof, and wherein a gate of said MOSFET is coupled to a voltage generating means.

38. A semiconductor integrated circuit device according to claim 37, further comprising control means coupled between a gate of said MOSFET and said voltage generating means.

39. A semiconductor integrated circuit device according to claim 38, wherein said voltage generating means comprises a first voltage generating means coupled between said control means and a third terminal to which said reference voltage is supplied, and a second voltage generating means coupled between said control means and a fourth terminal to which a second voltage is supplied.

40. A semiconductor integrated circuit device according to claim 39, wherein said reference voltage is greater than said second voltage.

41. A semiconductor integrated circuit device according to claim 38, wherein said control means comprises a first diode and a second diode, wherein a first input terminal of said first diode is coupled to a second output terminal of said second diode and a first output terminal of said first diode is coupled to a second input terminal of said second diode, wherein said first input terminal of said first diode is coupled to said voltage limitation means and said first output terminal of said first diode is coupled to said gate of said MOSFET.

42. A semiconductor integrated circuit device according to claim 41, wherein said first diode and said second diode are constructed of a MOSFET, respectively.

43. A semiconductor integrated circuit device according to claim 37, wherein said voltage generating means comprises a first voltage generating means coupled between said gate of said MOSFET and a third terminal to which said reference voltage is supplied, and a second voltage generating means coupled between said gate of said MOSFET and a fourth terminal to which a second voltage is supplied.

44. A semiconductor integrated circuit device according to claim 43, wherein said reference voltage is greater than said second voltage.

45. A semiconductor integrated circuit device according to claim 34, wherein said precharge means is constructed of at least one MOSFET.

46. A semiconductor integrated circuit device according to claim 34, wherein said switching means is constructed of a complementary MOSFET.

* * * * *